United States Patent
Westmoreland et al.

Patent Number: 5,393,564
Date of Patent: Feb. 28, 1995

[54] HIGH EFFICIENCY METHOD FOR PERFORMING A CHEMICAL VAPOR DEPOSITION UTILIZING A NONVOLATILE PRECURSOR

[75] Inventors: Donald L. Westmoreland; Gurtej S. Sandhu, both of Boise, Id.

[73] Assignee: Micron Semiconductor, Inc., Boise, Id.

[21] Appl. No.: 236,946

[22] Filed: May 2, 1994

Related U.S. Application Data

[63] Continuation-in-part of Ser. No. 62,203, May 14, 1993, abandoned.

[51] Int. Cl.$^6$ .............................................. C23C 16/00
[52] U.S. Cl. ................... 427/248.1; 427/255.2
[58] Field of Search ...................... 427/248.1, 255.2

[56] References Cited

U.S. PATENT DOCUMENTS 4,906,493  3/1990  Laine .................... 427/228
4,993,361  2/1991  Unvala ................... 118/715

Primary Examiner—Schrive Beck
Assistant Examiner—David M. Maiorana
Attorney, Agent, or Firm—Susan B. Collier

[57] ABSTRACT

The invention is a method directed to the use of a nonvolatile precursor, either a solid precursor or a liquid precursor, suitable for chemical vapor deposition (CVD), including liquid source CVD (LSCVD), of a semiconductor film. Using the method of the invention the nonvolatile precursor is dissolved in a solvent. The choice of solvent is typically an inorganic compound that has a moderate to high vapor pressure at room temperature and that can be liquified by a combination of pressure and cooling. The solution thus formed is then transported at an elevated pressure and/or a reduced temperature to the CVD chamber. In CVD the solution evaporates at a higher temperature and a lower pressure upon entry to the CVD chamber, and the nonvolatile precursor, in its gaseous state, along with a gas reactant, produces a product which is deposited as a thin film on a semiconductor wafer. In LSCVD the liquid enters the chamber, contacts the wafer, evaporates, produces a product which is deposited as a thin film on the wafer surface.

18 Claims, 1 Drawing Sheet ure at or above $10^{-10}$ Torr.
HIGH EFFICIENCY METHOD FOR PERFORMING A CHEMICAL VAPOR DEPOSITION UTILIZING A NONVOLATILE PRECURSOR

REFERENCE TO RELATED APPLICATION

This application is a continuation-in-part of application having Ser. No. 08/062,203, filed on May 14, 1993, abandoned, and entitled A High Efficiency Method for Performing a Chemical Vapor Deposition Utilizing a Nonvolatile Precursor.

FIELD OF THE INVENTION

The invention relates to the manufacture of semiconductor circuits on semiconductor wafers, and more particularly to chemical vapor depositions of materials on the wafer.

BACKGROUND OF THE INVENTION

A large number of nonvolatile metal organic precursors which are suitable in microelectronics applications for chemical vapor deposition (CVD) of thin films are solids at temperatures at or below 1500 Kelvin and at pressures at or above $10^{-10}$ Torr. In fact, a majority of metal-organic compounds with attributes desirable for CVD are solids. These compounds have chemical stability, molecular structures, and reactivity which make them ideally suited for CVD application. However, vapor transport is difficult utilized in semiconductor manufacture. Thus, vapor transport of these precursors is a major hinderance to the implementation of the precursors in a production environment. If the precursor has a sufficient vapor pressure, then sublimation of the precursor for transportation of its vapor is the only option available, however this is difficult to control in a manufacturing environment. Solid precursors have been dissolved, transported, and delivered in organic solution, but these solutions usually leave a large carbon residue.

OBJECTS OF THE INVENTION

It is an object of the invention to provide reliable production worthy methods for fast delivery of nonvolatile precursors to the chemical vapor deposition (CVD) chamber.

The invention features dissolving a nonvolatile precursor, either solid or liquid, in a solution and delivering the precursor in the solution to a CVD chamber.

The invention is a very efficient method for transporting a nonvolatile precursor for CVD in the manufacturing environment and incorporates a minimum amount of unwanted by-product in the desired film. The method entails a process which is easily controlled and therefore predictable with repeatable results.

SUMMARY OF THE INVENTION

The invention is a method directed to the use of a nonvolatile precursor, either solid or liquid, in a chemical vapor deposition (CVD) process. A solid precursor, as referenced herein, is a precursor which is in a solid state at a temperature at or below 1500 Kelvin and at a pressure at or above $10^{-10}$ Torr, and a liquid precursor, as referenced herein, is a precursor which is in a liquid state at a temperature at or below 1500 Kelvin and at a pressure at or above $10^{-10}$ Torr. Using the method of the invention the nonvolatile precursor is dissolved in a solvent to form a solution. The nonvolatile precursor is then transported in the solution at a pressure and a temperature necessary to maintain it as a liquid to the CVD chamber. The solution is transported in a continuous liquid stream to the CVD chamber. A continuous liquid stream is an unbroken non-nebulized stream of liquid which may be passed to the chamber without interruption or may be passed to the chamber in a pulse or batch. The pulse or batch can be thought of as a portion of the solution.

In a first embodiment the solution becomes a gas during rapid evaporation of the solution at a high temperature and at a low pressure. The gaseous form of the precursor reacts with a reactant at the heated surface of the wafer.

In a second embodiment the method of the invention can be used in liquid source chemical vapor deposition where the solution is applied to the wafer before being evaporated.

DETAILED DESCRIPTION OF THE INVENTION

Figure 1:
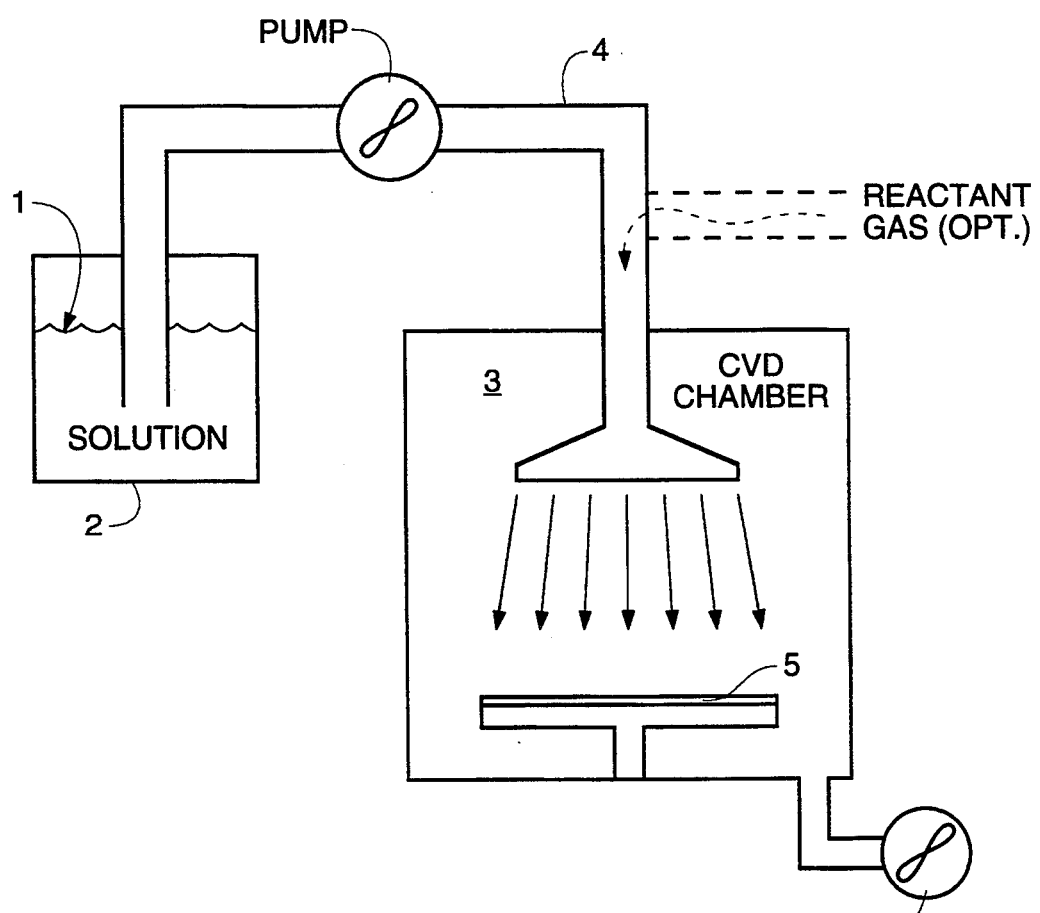
FIG. 1 is a cross section of a simplified representation of the equipment used to perform a chemical vapor deposition on a semiconductor wafer.

The invention is a method directed to the use of a nonvolatile precursor suitable for chemical vapor deposition (CVD). The nonvolatile precursor may be a solid or a liquid. The solid precursor, as referenced herein, is a precursor which is in a solid state at a temperature at or below 1500 Kelvin and at a pressure at or above $10^{-10}$ Torr, and the liquid precursor, as referenced herein, is in a liquid state at a temperature at or below 1500 degrees Kelvin and at a pressure at or above $10^{-10}$ Torr. The method can be understood by studying FIG. 1 in conjunction with the following description. Using the method of the invention, the nonvolatile precursor is dissolved in a solvent to form a solution 1 of the precursor and the solvent. It is important that the precursor and the solvent do not react with each other in liquid form. The solvent can be either a reactive component which makes up a part of the film or it can be simply a nonreactive inert carrier.

The solution 1 is formed in a chamber 2. The solution 1 is then transported in liquid form at elevated pressures and/or reduced temperatures to a chamber 3 through a transport device 4. The liquid is transported as a continuous liquid stream to the chamber 3. A continuous liquid stream is an unbroken non-nebulized stream of liquid which may be passed to the chamber without interruption or may be passed to the chamber in a pulse or batch. The pulse or batch can be thought of as a portion of the solution. When the solution 1 reaches the chamber 3, at least two options are available.

In a first embodiment the solution 1 becomes a gas upon entry to the chamber 3. The chamber 3 is held at a high enough temperature and a low enough pressure to effect rapid evaporation of the solution 1. The precursor remains in the gas phase until it reacts with a reactant at a heated surface of the wafer 5. The reactant may be either the solvent in its gaseous state or may be another gas injected into the chamber 3. In either case a material is produced during the reaction and deposited as a film on the wafer 5. Typically, a gaseous by-product is also produced in the reaction.

One example of the first embodiment comprises a solid precursor of bis(cyclopentadienly)titanium diazide (Tiaz) dissolved in liquid ammonia (LNH$_3$) to form a solution 1 of Tiaz in LNH$_3$ in chamber 2 when the temperature of chamber 2 is 20° C. or less and the pressure is 120 psi or greater. The Tiaz in LNH$_3$ is then transported to the chamber 3 through the transport device 4. The temperature and pressure of the transport device 4 are regulated in order to keep the solution in it liquid form. In this example the temperature is 20° or less and the pressure is 120 psi or greater. The solution 1 immediately vaporizes upon entry into chamber 3. The rapid evaporation occurs because the chamber 3 is held at a temperature of 100° C. and a pressure of 500 millitorr and the water surface is held at 550° C. Hydrogen is injected into the chamber and combines with the vaporized Tiaz to form titanium nitride which is deposited on the wafer as a thin film. A by-product cyclopentadiene remains and is pumped from the chamber with the ammonia vapor.

The temperatures and pressures may be varied as long as the temperature and pressure of the chamber and transport device allow the precursor to remain dissolved in the solution. In addition the temperature and pressure of the chamber may vary as long as the solution is vaporized.

In a second embodiment, the solution 1 is applied to the wafer 5 before being evaporated. This is typically referred to as liquid source chemical vapor deposition. The solution is delivered through a nebulizer which delivers a very fine mist that settles evenly over the entire wafer. When the solution first contacts the wafer the temperature of the wafer 5 may be either higher, or lower, or the same as the temperature of the solution 1. In the first case the wafer temperature and chamber 3 pressure must be maintained so that the solvent evaporates upon contact with the wafer surface and so that the precursor reacts immediately with the reactant gas, which is either injected into the chamber or formed during evaporation of the solution, to deposit a film. In the latter two cases, the solution remains on the wafer until the wafer temperature is increased to evaporate the solvent. As in the case of the first embodiment the gaseous state of the precursor reacts with a gas reactant thereby producing a material deposited as a film on the wafer surface. The reaction typically produces a gaseous by-product in addition to the deposited film. The by-product and the solvent vapor, in the case where the vapor doesn't react with the precursor to form the film, are then removed from the chamber 3.

An example of the process of the second embodiment comprises a precursor, zirconium tetrachloride, dissolved in a solvent, silicon tetrachloride, to form a solution in chamber 2 when the temperature of the chamber 2 is between 60° and 10° C. and the pressure is 60 psi or greater. The solution is then transported to the chamber 3 through the transport device 4. The temperature and pressure of the transport device 4 are regulated in order to maintain the solution in its liquid form. In this example the temperature and pressure of the transport device 4 are the same as the temperature and pressure of chamber 2. Chamber 3 is held at a pressure of 10 torr in order to help facilitate the vaporization of the solution on the wafer. The wafer temperature is 600° C. The zirconium tetrachloride in silicon tetrachloride solution is injected into the chamber 3 and reacts at the wafer surface to form a vapor and combines with hydrogen to form zirconium silicide which is deposited on the wafer to form a thin film. A by-product, hydrogen chloride, is formed and is pumped from the chamber with the excess silicon tetrachloride.

It is important to use the correct solvent when performing the method of the invention. The solvent must be able to evaporate quickly and leave no contaminates in the product film. Therefore common hydrocarbon solvents are unacceptable because they leave carbon residue incorporated in the wafer film, dependent on the wafer. Ideal solvents for this application are inorganic liquids such as: liquid ammonia (NH$_3$), liquid NO$_2$, liquid SO$_2$, liquid TiCl$_4$, liquid TaCl$_5$, liquid WF$_6$, liquid SiCl$_4$, borazine, dimethyl hydrazine, liquid xenonflourides, liquid phosphine, liquid arsine, diethylzinc, BCl$_3$, BF$_3$, SF$_6$, H$_2$S, SiF$_4$, CBrF$_3$, CCl$_2$F$_2$, CCl$_3$F, CClF$_3$, CCl$_4$, SiH$_2$Cl$_2$. Many of these solvents are gases at room temperature but are easily maintained as liquids with elevated pressure and reduced temperature. For example, ammonia boils at $-33°$ C. and is an excellent solvent. It is a further advantage that these gases are easily available at a low cost at the present time.

The following gases may be selected as reactant gases for forming the deposited film: hydrogen, ammonia, or silane.

The following are some of the solid precursors suitable for forming films on semiconductor wafers by the method of the invention: bis(cyclopentadienyl) titanium dichloride, ZrCl4, and tungsten carbonyl.

The following are some of the nonvolatile liquid precursors suitable for forming films on semiconductor wafers by the method of the invention: indenyltris(dimethylamido)zirconium, cyclopentadienyltris(diethylamido)titanium, and bis(cyclopentadienyl)bis(dimethylamido)titanium.

There are various combinations of nonvolatile precursors, solvents and reactants that may be used in the process of the invention.

It has been shown that the invention provides an efficient method for transporting nonvolatile precursors for CVD in the manufacturing environment.

Although the invention has been described in terms of a depositing materials on semiconductor wafers during chemical vapor depositions, the circuit and method have utility in other processes where a chemical vapor deposition is desired. Accordingly the invention should be read as limited only by the claims.

What is claimed is:

1. A method for performing a chemical vapor deposition of a film on a surface of a wafer, comprising the following steps:
    a) solubilizing a nonvolatile precursor in an inorganic solvent to form a liquid solution;
    b) transporting said liquid solution as a continuous liquid stream to a control chamber, said transporting performed at a temperature and a pressure to ensure a state of said nonvolatile precursor remains liquid;
    c) evaporating said liquid solution in said control chamber to change said state of said nonvolatile precursor to a vapor;
    d) creating a reaction between said vapor of said nonvolatile precursor and a reactant vapor; and
    e) depositing the film on the surface of the wafer in response to said reaction.

2. The method as specified in claim 1, further comprising the step of eliminating contaminates during the depositing of the film by selecting said inorganic solvent and said nonvolatile precursor to ensure non-reaction of said inorganic solvent and said nonvolatile precursor in said solution.

3. The method as specified in claim 1, further comprising the following steps:
   a) creating a by-product during said step of depositing; and
   b) removing said by-product from said chamber.

4. The method as specified in claim 1, further comprising the following steps:
   a) injecting said liquid solution into said control chamber; and
   b) controlling the temperature and pressure of said control chamber such that the temperature is high enough and the pressure is low enough to rapidly effect said step of evaporating said liquid solution when said liquid solution enters said control chamber.

5. The method as specified in claim 4, further comprising the step of heating said wafer to a temperature greater than said vapor of said nonvolatile precursor thereby precipitating said step of depositing.

6. The method as specified in claim 1, wherein said step of evaporating comprises the steps of:
   a) heating said wafer to a temperature capable of evaporating said liquid solution;
   b) applying said liquid solution to the surface of the wafer; and
   c) increasing a temperature of said liquid solution to said temperature capable of evaporating said liquid solution in response to said step of applying and said step of heating thereby effecting said step of evaporating.

7. The method as specified in claim 6, further comprising the following steps:
   a) nebulizing said liquid solution at said control chamber in order to create a mist of said liquid solution prior to said step of applying; and
   b) uniformly covering the surface of the wafer with said mist during said step of applying.

8. The method as specified in claim 6, further comprising the following steps:
   a) heating the wafer to a temperature greater than a temperature of said liquid solution prior to said step of applying; and
   b) controlling a temperature and a pressure of said control chamber in order to effect said step of evaporating.

9. The method as specified in claim 1, further comprising the step of creating said reactant vapor during said step of evaporating.

10. The method as specified in claim 1, further comprising the step of injecting said reactant vapor into said control chamber.

11. The method as specified in claim 1, wherein said nonvolatile precursor is a nonvolatile solid at a temperature at or above 1500 degrees Kelvin and at a pressure at or below $10^{-10}$ Torr.

12. The method as specified in claim 11, wherein said nonvolatile solid is selected from the group consisting of Tiaz, $ZrCl_4$, and biscyclopentadienyltitanium dichloride.

13. The method as specified in claim 1, wherein said nonvolatile precursor is a nonvolatile liquid at a normal temperature and pressure.

14. The method as specified in claim 13, wherein said nonvolatile liquid is selected from the group consisting of indenyltris(dimethylamido) zirconium, cyclopentadienyltris(diethylamido)titanium, and bis(cyclopentadienyl)bis(dimethylamido)titanium.

15. The method as specified in claim 1, wherein said inorganic solvent is selected from the group consisting of liquid ammonia ($NH_3$), liquid $NO_2$, liquid $SO_2$, liquid $TiCl_4$, liquid $TaCl_5$, liquid $WF_6$, liquid $SiCl_4$, borazine, hydrazine, liquid xenonfluorides, liquid phosphine, liquid arsine, diethylzinc, $BCl_3$, $BF_3$, $SF_6$, $H_2S$, $SiF_4$, $CBrF_3$, $CCl_2F_2$, $CCl_3F$, $CClF_3$, $CCl_4$, $SiH_2Cl_2$.

16. The method as specified in claim 1, wherein said reactant vapor is selected from the group consisting of hydrogen, ammonia, and silane.

17. The method as specified in claim 1, wherein said step of transporting further comprises transporting said liquid solution in pulses.

18. A method for depositing a film on a surface, comprising the following steps:
   a) combining a nonvolatile precursor and an inorganic solvent to form a solution;
   b) adjusting a temperature and a pressure in order to maintain said solution in a liquid state;
   c) transporting said solution as a continuous liquid stream to a chamber;
   d) vaporizing the solution at said chamber to form a precursor vapor;
   e) creating a reaction with a reactant vapor and said precursor vapor; and
   f) depositing the film on the surface in response to said step of creating.

* * * * *